United States Patent [19]

Blomley

[11] 4,127,825

[45] Nov. 28, 1978

[54] LINEAR FREQUENCY DISCRIMINATOR

[75] Inventor: Peter F. Blomley, Coppet, Switzerland

[73] Assignee: Motorola, Inc., Schaumburg, Ill.

[21] Appl. No.: 784,985

[22] Filed: Apr. 6, 1977

Related U.S. Application Data

[63] Continuation of Ser. No. 594,908, Jul. 10, 1975, abandoned.

[51] Int. Cl.² .................... H03D 3/06; H04N 9/50
[52] U.S. Cl. .................... 329/103; 307/233 R; 325/349; 325/487; 329/136; 329/137; 358/23
[58] Field of Search .................... 329/110, 136–139, 329/103; 307/232, 233 R, 295; 328/133, 155; 325/349, 487; 358/17, 23

[56] References Cited

U.S. PATENT DOCUMENTS

| 2,976,408 | 3/1961 | Colaguori | 329/139 X |
|---|---|---|---|
| 3,084,291 | 4/1963 | Verstraelen et al. | 329/138 |
| 3,092,780 | 6/1963 | Fisher | 329/139 |
| 3,436,647 | 4/1969 | Gobeli et al. | 328/155 X |
| 3,593,167 | 7/1971 | Koulopoulos | 328/133 X |
| 3,609,408 | 9/1971 | Motisher et al. | 328/133 X |
| 3,701,030 | 10/1972 | Gocho et al. | 329/137 X |
| 3,832,656 | 8/1974 | Ito et al. | 307/295 X |

*Primary Examiner*—Siegfried H. Grimm
*Attorney, Agent, or Firm*—Maurice J. Jones, Jr.

[57] ABSTRACT

A quadrature phase detector having a tuned circuit connected between inputs thereof with a voltage variable reactance connected therein and further connected to the output of the phase detector for tuning the tuned circuit in accordance with the output of the phase detector, and a voltage variable capacitor in the tuned circuit connected to receive a signal from a comparator which compares the output of the phase detector to a reference signal so that a signal having a predetermined frequency can be applied to the input of the phase detector and the tuned circuit of the phase detector is tuned to a predetermined reference frequency. The tuned circuit input of the phase detector continually tracks the input signal, which may be a FM color subcarrier signal. Additionally, there is compensation for the inherent nonlinearity in the tuned circuit.

12 Claims, 4 Drawing Figures

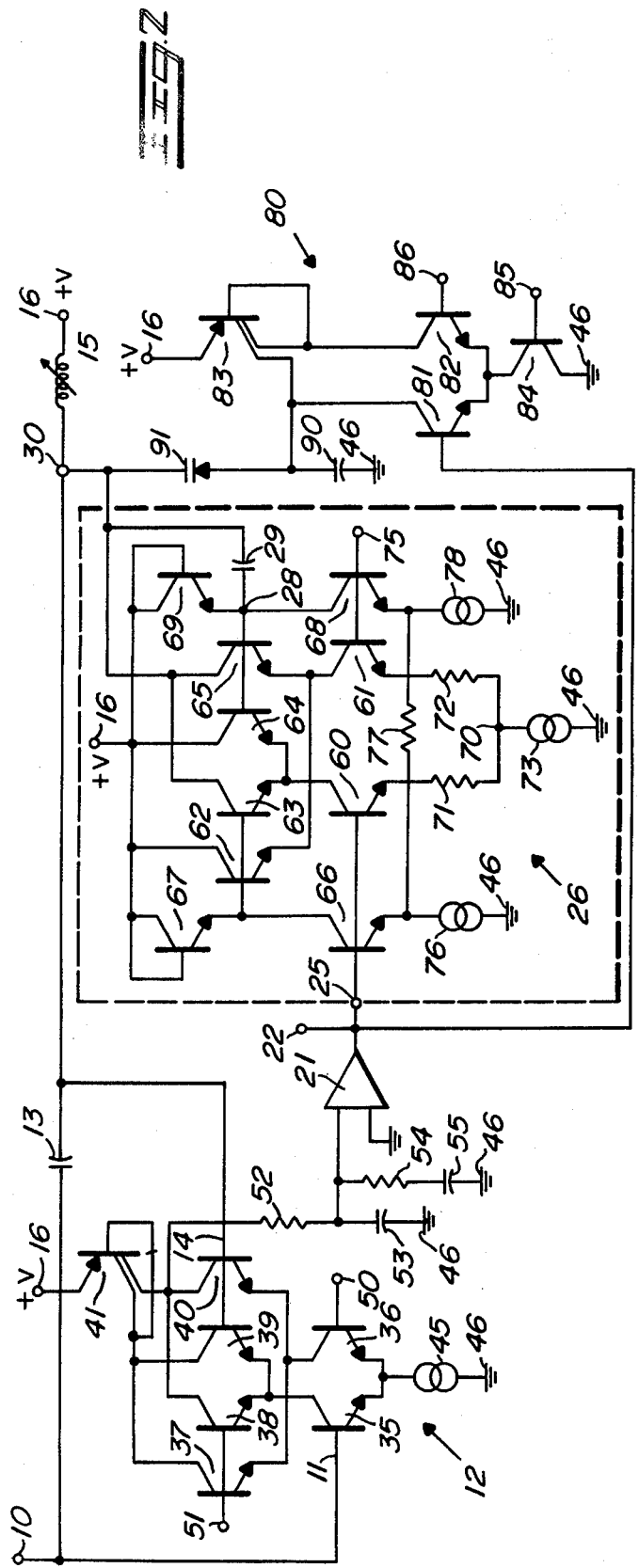
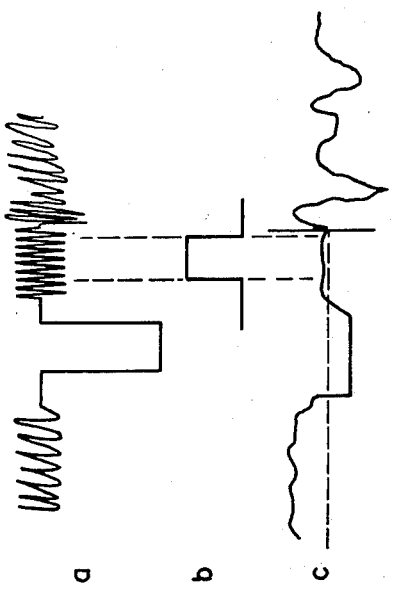
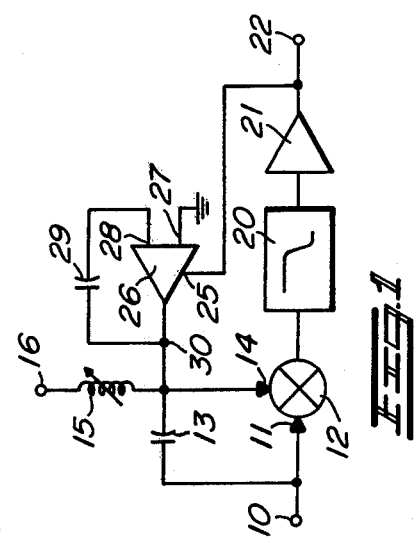
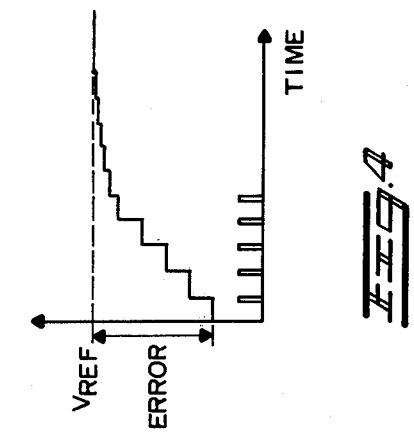

LINEAR FREQUENCY DISCRIMINATOR

This is a continuation of application Ser. No. 594,908, filed July 10, 1975 and now abandoned.

BACKGROUND OF THE INVENTION

1. Field of the Invention

The present invention pertains to a linear frequency discriminator which may include a reference stabilized center frequency. Discriminators of this type are useful in video tape recorders and are especially useful in the SECAM television system where the color information is transmitted in the form of color difference signals using a frequency modulated subcarrier. In order to provide a color image free of color errors and random drift in the reference background color it is necessary that the color signal frequency discriminator produce from the frequency modulated color difference signals, video color difference signals in which the amplitude faithfully corresponds to the frequency variations representing color difference information. This is necessary to insure that the color difference signals when compared with the luminance signal will produce color signals at the color display device corresponding to the color signals contained in the frequency modulated subcarrier. Since the quiescent discriminator output (no frequency modulation of the subcarrier) provides for an essentially black and white picture which is tinted to form the current color picture when frequency modulation of the color subcarrier occurs, it is also necessary to insure that an unmodulated color subcarrier signal produces either zero output or the correct reference level when no frequency modulation is present. If the discriminator drifts or has been mistuned the background color will drift or be in error. Accordingly, the system requires a linear frequency discriminator for the frequency modulated color subcarrier information and one which not only is carefully adjusted but free of tuning drift.

2. Description of the Prior Art

Prior art systems have used frequency discriminators of conventional design such as the Travis or Foster Seely types which convert the frequency modulated signal to a pair of signals one of which increases in amplitude as the frequency of the incoming signal is increased and one of which decreases in amplitude as the frequency increases and vice versa. By taking the amplitude difference of these signals a base band signal can be derived the amplitude of which is a measure of the instantaneous frequency of the incoming carrier signal. These systems require complex networks to derive the signals containing the frequency difference information. It is difficult to derive networks which maintain a linear frequency amplitude conversion characteristic over a wide range of frequencies.

A second method makes use of the product between the incoming signal and a phase shifted complement of the incoming signal such that the phase difference between the two signals has a linear relationship to the frequency modulation of the carrier. Detectors of this type include the quadrature detector and the phase locked loop, both of which exhibit a sinusoidal transfer characteristic which is linear for a narrow range of frequency modulation only.

SUMMARY OF THE INVENTION

The present invention pertains to a linear frequency discriminator including a phase detector with a tuned circuit connected between the two inputs thereof and a variable reactance included in the tuned circuit and adjustable with the output signal of the phase detector.

The present invention further pertains to a phase detector with a tuned circuit connected between the inputs thereof and including a voltage variable capacitor tunable with the output of a comparator, one input of which has a reference signal thereon and the other input of which is connected to receive the output of the phase detector so that a signal of a predetermined frequency applied to the phase detector adjusts the variable reactance and, consequently, the tuned circuit to tune the phase detector to a predetermined reference frequency.

It is an object of the present invention to provide a new and improved linear frequency discriminator.

It is a further object of the present invention to provide a linear frequency discriminator having an improved linear response to frequency modulation of the signal applied thereto.

It is a further object of the present invention to provide a linear frequency discriminator which is periodically adjusted to a reference frequency to compensate for drift and the like.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a block-semischematic diagram of a frequency discriminator embodying the present invention;

FIG. 2 is a schematic diagram of the circuitry illustrated in FIG. 1;

FIG. 3 illustrates waveforms appearing at various input and output points in the circuitry of FIG. 2; and FIG. 4 is a graphic representation of the correction response of the circuitry illustrated in FIG. 2.

DESCRIPTION OF THE PREFERRED EMBODIMENT

Referring specifically to FIG. 1, an input signal derived from the FM SECAM color subcarrier is applied to terminal 10 and is connected to one input 11 of a phase detector, which in this embodiment is illustrated as a multiplier 12, and through a capacitor 13 to a second input 14 of the multiplier 12. A tuning coil 15, which may be variable or fixed as desired, is connected from the input 14 to a terminal 16 which is adapted to have a suitable source of voltage applied thereto. The capacitor 13 and coil 15 form a tuned circuit which shifts the phase of signals applied to the input terminal 10, in this embodiment approximately 90°, before applying the phase shifted complement to the input 14 of the multiplier 12. The output of the multiplier 12 is connected through a low pass filter 20 and optional amplifier 21 to an output terminal 22. The output of the amplifier 21 is also connected to a gain control input 25 of an amplifier 26. In the present embodiment the amplifier 26 is a differential amplifier having a first input 27 which is connected to a reference voltage and a second input 28 which is connected through a capacitor 29 to an output terminal 30. The output terminal 30 of the amplifier 26 is connected to the input 14 of the multiplier 12.

The amplifier 26 and capacitor 29 operate as a variable reactance, which in this embodiment is a variable capacitance, and adjust the tuning of the tuned circuit in accordance with the output signal from the multiplier 12. Thus, the multiplier 12 and the tuned circuit associated therewith continually track incoming signals applied to the input terminal 10 and maintain the frequency discriminator in the linear portion of its response. It will of course be understood by those skilled in the art that "tracking" the signal does not imply that the tuned circuit is tuned to exactly the same frequency as the input signal. In fact, the frequency of the tuned circuit must be offset slightly from the frequency of the incoming signal to develop a small control voltage which adjusts the variable reactance.

The resonant frequency of the tuned circuit is inversely proportional to the square root of the inductance and the capacitance in the tuned circuit. Therefore, a direct adjustment of either the inductance or the capacitance in the tuned circuit in accordance with changes in frequency of the signal applied to the input terminal 10 will result in a nonlinear response of the frequency discriminator. To compensate for this inherent nonlinearity in the tuned circuit, a nonlinear element is included in the amplifier 26 so that the variable capacitance introduced into the tuned circuit by the fixed capacitor 29 and amplifier 26 is nonlinear in response to output signals from the multiplier 12. This nonlinearity should be approximately the inverse of the inherent nonlinearity in the tuned circuit, but any reasonable approximation will improve the linearity of the frequency discriminator.

Referring to FIG. 2, the multiplier, generally designated 12, includes six npn type transistors 35–40 and a pnp type split collector transistor 41. The emitters of the transistors 35 and 36 are connected together and through a current source 45 to ground 46. Current sources, such as the current source 45 and any other current sources illustrated in the schematics throughout this description, are well-known to those skilled in the art and are not described in detail. The base of the transistor 35 is the input 11 of the multiplier 12. The base of the transistor 36 is connected to a terminal 50 adapted to have a reference voltage applied thereto. The reference voltage 50, as well as other reference voltages referred to throughout this description may be provided by voltage dividers or any other convenient source which is not shown in detail to simplify the description. The collector of the transistor 35 is connected directly to the common connected emitters of the transistors 38 and 39 and the collector of the transistor 36 is connected directly to the common connected emitters of the transistors 37 and 40. The bases of the transistors 37 and 38 are connected together and to a terminal 51 having a reference voltage applied thereto. The bases of the transistors 39 and 40 are connected together and to the input terminal 14 of the multiplier 12. The collectors of the transistors 37 and 39 are connected together and to one collector of the split collector transistor 41 the emitter of which is connected directly to the positive voltage terminal 16. The collectors of the transistors 38 and 40 are connected together. The collector of the transistor 40 is also connected through a resistor 52 to the input of the optional amplifier 21. The input of the amplifier 21 is also connected through a capacitor 53 to ground 46 and through a series connected resistor 54 and capacitor 55 to the ground 46. The resistor 52 and capacitor 53 form a low pass filter and the series connected resistor 54 and capacitor 55 form a damping network to reduce, or prevent, the output signal from overshooting and producing ringing. The amplifier 21 is optional because it may or may not be required, depending upon the amplification in the mixer 12 and the required gain in the loop.

The variable reactance in the tuned circuit is, in this embodiment, a variable capacitance including the fixed capacitor 29 and the amplifier generally designated 26 in FIG. 2. Amplifier 26 includes 10 npn type transistors 60–69. The emitter of transistor 60 is connected to a terminal 70 through a resistor 71 and the emitter of the transistor 61 is connected through a resistor 72 to the terminal 70. The terminal 70 is connected through a constant current source 73 to ground 46. The collector of the transistor 60 is connected to common connected emitters of transistors 63 and 64 and the collector of the transistor 61 is connected to common connected emitters of the transistors 62 and 65. The bases of the transistors 60 and 66 are connected together and to the gain control input 25 for the amplifier 26. The bases of the transistors 61 and 68 are connected together and to a terminal 75 which has a reference voltage applied thereto. The emitter of the transistor 66 is connected to ground 46 through a constant current source 76 and through a resistor 77 to the emitter of the transistor 68, which is connected to ground 46 through a constant current source 78. The collector of the transistor 66 is connected to the bases of the transistors 62 and 63 and to the emitter of the transistor 67. The collector and base of the transistor 67 are connected together and to the positive voltage terminal 16. The collector of the transistor 68 is connected to the input terminal 28 of the amplifier 26, to the bases of the transistors 64 and 65 and to the emitter of the transistor 69. The collector and base of the transistor 69 are connected together and to the positive voltage terminal 16. The collectors of the transistors 62 and 64 are connected directly to the positive voltage terminal 16 and the collectors of the transistors 63 and 65 are connected together and to the terminal 30. All of the circuitry described may be conveniently incorporated into an integrated circuit and the terminal 30 is a connection pad with the coil 15 connected externally.

In general, the operation of the multiplier 12 and amplifier 26 is as follows. When the frequency of the input signal applied to the terminal 10 is equal to the resonant frequency of the tuned circuit the two signals applied to the inputs 11 and 14 of the multiplier 12 are in quadrature, or 90° out of phase, and the output at the terminal 22 is zero or some fixed voltage. As the frequency of the signal applied to the input terminal 10 varies a signal appears at the output terminal 22 and the input terminal 25 of the amplifier 26. This signal is a varying DC signal because of the filter 20. This varying DC signal controls the current flowing through the transistor 66 and the diode connected transistor 67 and, thus, the base current supplied to the transistors 62 and 63. Also, the input signal affects the base current supplied to the transistors 64 and 65 inversely because of the coupling through the constant current sources 76 and 78 and the resistor 77. In addition to affecting the base current of the transistors 62 and 63, the input signal controls the emitter currents therein through the transistor 60 and, inversely, the transistor 61. Because the input signal controls the base and emitter currents of the transistors 62–65, the current supplied to the fixed capacitor 29 and dictating the size of the capacitance appearing in the tuned circuit contains a second order function which is a nonlinear function generally the inverse of the nonlinear relationship between resonance and the capacitance in the tuned circuit. Thus, the nonlinearity of the amplifier 26 counteracts the inherent nonlinearity in the tuned circuit resulting in a linear frequency discriminator. While a variable capacitance has been described in conjunction with the tuned circuit, it should be understood that a similar circuit can be constructed to provide a variable inductance if desired. Further, while a specific variable reactance circuit is illustrated it should be understood that circuits other than the one illustrated may be utilized to provide a variable reactance.

Referring to FIG. 2, a comparator generally designated 80 includes a pair of npn type transistors 81 and 82 and a pnp type split collector transistor 83. The emitters of the transistors 81 and 82 are connected together and through an npn type transistor 84, which operates as a constant current source, to ground 46. The base of the current source transistor 84 is connected to a terminal 85 which serves as an input for receiving a strobe pulse and turning on the comparator. The base of the transistor 81 is connected to the output terminal 22 of the phase detector (through filter 20 and amplifier 21 if present). The base of the transistor 82 is connected to a terminal 86 which is adapted to have a reference voltage applied thereto which is representative of a predetermined frequency and should compare to the output voltage of the phase detector 12 at terminal 22 when the predetermined frequency is applied to input terminal 10. The collector of the transistor 82 is connected to the base and one of the collectors of the transistor 83 while the collector of the transistor 81 is connected to the other collector of the transistor 83. The emitter of the transistor 83 is connected directly to the positive voltage terminal 16. The collector of the transistor 81 is also connected through a large capacitor 90 to ground 46 and through a voltage variable capacitor 91 to the terminal 30.

Wave form a in FIG. 3 is a typical SECAM signal with a signal of a predetermined frequency impressed upon the back porch of the line sync pulse. Wave form b is a stable pulse manufactured from the line sync pulse simultaneously with the impressed signal of the predetermined frequency. The string of pulses illustrated in wave form b of FIG. 3, (only one representative pulse is shown) are applied to the terminal 85 of the comparator 80 and the SECAM television signal illustrated in wave form a of FIG. 3 is applied to the terminal 10 of the frequency discriminator. Thus, when the signal having the predetermined frequency is applied to the phase detector the current sink transistor 84 is turned on so that the output of the phase detector is compared to the reference signal applied to the terminal 86. The capacitor 90 is sufficiently large to maintain a charge through several strobe pulses and supplies a voltage to the voltage variable capacitor 91 to adjust the tuning of the tuned circuit so that the resonance frequency thereof approximately coincides with the transmitted predetermined frequency. As illustrated in FIG. 4, adjusting the resonance of the tuned circuit may require several strobe pulses and the capacitor 90 operates to store the voltage last applied thereto until the next strobe pulse is applied to again shift the resonance frequency toward the predetermined frequency. This is especially useful to compensate for drift due to changes in ambient temperature and the like, since the resonant frequency of the tuned circuit is compared to the transmitted standard during the retrace of each horizontal sweep. It should of course be understood that the frequency of the discriminator could be adjusted more or less frequent as required. Also, while the circuit has been illustrated and described in conjunction with a SECAM television signal, it should be understood that there are many other uses for this circuitry including video tape recording and the like.

Thus, a frequency discriminator is disclosed having improved linearity and further including circuitry for periodically adjusting the tuned circuit therein relative to a transmitted standard or predetermined frequency. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A linear frequency discriminator comprising:
   (a) a phase detector having a pair of inputs and an output, signals at the output being an indication of the phase difference between signals applied to the pair of inputs and one of said inputs of said phase detector being adapted to receive a modulated input signal;
   (b) a tuned circuit including a variable reactance and having an output connected to the other of said pair of inputs of said phase detector, said tuned circuit further having a signal input for receiving said modulated input signal, and a control input for receiving a control signal derived from the signals at said output of said phase detector to adjust said variable reactance and retune the tuned circuit to track the frequency of said modulated input signal;
   (c) said variable reactance including a fixed capacitive means and an amplifier means connected so that the reactance of said variable reactance depends on the current gain of said amplifier means, said current gain of said amplifier means varying as a function of said control signal, said tuned circuit having a nonlinear relationship between the resonant frequency thereof and the value of said variable reactance, and said amplifier means including a nonlinear element for counteracting said nonlinearity in said tuned circuit to provide a signal at said output of said phase detector which varies linearly with changes of phase in said modulated input signal; and
   (d) means for connecting signals at said output of said phase detector to said control input of said tuned circuit and for providing the output signal of the linear frequency discriminator.

2. A linear frequency discriminator as claimed in claim 1 wherein the phase detector is a multiplier.

3. A linear frequency discriminator as claimed in claim 1 wherein said tuned circuit provides a quiescent phase difference between said pair of inputs of the phase detector of approximately 90°.

4. A linear frequency discriminator as claimed in claim 1 wherein said amplifier means includes a differential amplifier with common emitters and a variable current source in the common emitter circuit, said amplifier means further including circuitry connected to the variable current source for controlling the variable current source in accordance with said control signal which is applied thereto.

5. A linear frequency discriminator as claimed in claim 4 wherein the differential amplifier has a base input connected to said variable current source and the circuitry controls current applied to said base input and the common emitter circuit in accordance with said control signal, said circuitry operating nonlinearly by providing a current in the amplifier which includes a square term.

6. A linear frequency discriminator as claimed in claim 1 wherein said means for connecting signals includes a filter and an amplifier.

7. A linear frequency discriminator as claimed in claim 1 including a variable capacitance in the tuned circuit, a comparator having a pair of inputs with a reference signal representative of a predetermined frequency applied to one of the inputs and the other input connected to the output of the phase detector, said comparator having an output connected to said variable capacitance for adjusting said variable capacitance to tune the tuned circuit until the signal at the output of the phase detector compares to the reference signal.

8. A linear frequency discriminator as claimed in claim 7 including in addition means for applying a periodic reference signal having a frequency equal to the predetermined frequency to said one of said pair of inputs of said phase detector for adjusting the discriminator to the reference signal.

9. A linear frequency discriminator as claimed in claim 8 wherein said means for applying a signal include circuitry providing a television synchronizing signal with the signal having the predetermined frequency periodically impressed thereon.

10. A frequency discriminator comprising:
(a) a phase detector having a pair of inputs and an output and including a tuned circuit for providing a phase difference between signals applied to the pair of inputs;
(b) means responsive to said output of said phase detector for providing the output signal of the frequency discriminator;
(c) a variable capacitance having an input for receiving a control signal to adjust the capacitance thereof and connected into the tuned circuit of said phase detector;
(d) a comparator having a pair of inputs with a reference signal representative of a predetermined frequency applied to one of the inputs and the other input coupled to the output of the phase detector, said comparator having an output connected to the input of said variable capacitance for adjusting said variable capacitance to tune the tuned circuit until the signal at the output of the phase detector compares to the reference signal; and
(e) means for applying a signal having a predetermined frequency to said one of said pair of inputs of said phase detector for tuning the tuned circuit to a predetermined reference value.

11. A linear frequency discriminator as claimed in claim 10 wherein the means for applying the signal includes circuitry for applying the signal periodically.

12. A linear frequency discriminator adapted to receive a composite signal having periodic information signals with standard frequency signals periodically interposed therebetween comprising:
(a) a phase detector having first and second inputs and an output, signals at the output being an indication of the phase difference between signals applied to the first and second inputs;
(b) a tuned circuit including a variable reactance and having an output connected to one of the first and second inputs of said phase detector, said tuned circuit further having a signal input adapted to receive the composite signal and connected to the other of the first and second inputs of said phase detector and a control input for receiving a control signal to adjust the variable reactance and retune the tuned circuit to track the frequency of the periodic information signals of the composite signal at the signal input;
(c) means for connecting signals at the output of said phase detector to the control input of said tuned circuit and for providing the output signal of the frequency discriminator;
(d) a variable capacitance connected into said tuned circuit for controlling the resonance thereof and having an input for receiving a control signal to adjust the capacitance thereof;
(e) a comparator having a pair of inputs with a reference signal representative of a predetermined frequency applied to one of the inputs and the other input coupled to the output of said phase detector, said comparator having an output connected to the input of said variable capacitance for adjusting said variable capacitance to tune the tuned circuit until the signal at the output of said phase detector compares to the reference signal; and
(f) switching means connected to said comparator for turning off said comparator during reception of the periodic information signals and turning on said comparator during reception of the standard frequency signals.

* * * * *